(12) United States Patent
Cahill et al.

(10) Patent No.: US 8,295,058 B2
(45) Date of Patent: Oct. 23, 2012

(54) STRUCTURE FOR ENHANCING REFERENCE RETURN CURRENT CONDUCTION

(75) Inventors: Joseph J. Cahill, Austin, TX (US);
Anand Haridass, Bangalore (IN);
Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 12/641,381

(22) Filed: Dec. 18, 2009

(65) Prior Publication Data

US 2011/0147068 A1 Jun. 23, 2011

(51) Int. Cl.
*H05K 1/11* (2006.01)
*H05K 7/14* (2006.01)
*H05K 9/00* (2006.01)

(52) U.S. Cl. ......... 361/794; 361/799; 361/816; 361/818
(58) Field of Classification Search .......... 174/262–266; 361/792–795, 799, 816, 818; 716/137
See application file for complete search history.

(56) References Cited

U.S. PATENT DOCUMENTS

| | | | | |
|---|---|---|---|---|
| 5,926,377 | A * | 7/1999 | Nakao et al. ................. | 361/763 |
| 6,392,164 | B1 * | 5/2002 | Iwaki et al. ................... | 174/262 |
| 6,479,764 | B1 | 11/2002 | Frana et al. | |
| 6,964,884 | B1 | 11/2005 | Chan et al. | |
| 6,993,739 | B2 | 1/2006 | Becker et al. | |
| 7,765,504 | B2 * | 7/2010 | Douriet et al. ................ | 716/122 |
| 7,882,469 | B2 * | 2/2011 | Budell et al. ................. | 716/106 |
| 2006/0144616 | A1 | 7/2006 | Lin et al. | |
| 2006/0151205 | A1 * | 7/2006 | Lim ............................. | 174/260 |
| 2006/0180343 | A1 | 8/2006 | Chan et al. | |
| 2007/0170574 | A1 | 7/2007 | Lauxtermann et al. | |
| 2007/0230149 | A1 * | 10/2007 | Bibee ............................ | 361/788 |
| 2008/0180245 | A1 | 7/2008 | Hsu et al. | |
| 2008/0230258 | A1 * | 9/2008 | Shen et al. .................... | 174/251 |

(Continued)

FOREIGN PATENT DOCUMENTS

JP 2001-102753 4/2001

OTHER PUBLICATIONS

Chen, Juan et al., "Electrical Impact of High-Speed Bus Crossing Plane Split", IEEE, 2002, pp. 861-865.

(Continued)

*Primary Examiner* — Timothy Thompson
*Assistant Examiner* — Sherman Ng
(74) *Attorney, Agent, or Firm* — Stephen J. Walder, Jr.; Diana R. Gerhardt

(57) ABSTRACT

An apparatus is provided that comprises a plurality of signaling planes providing signal pathways and at least one internal reference plane providing either a voltage or a ground connection. The at least one internal reference plane are provided between at least two of the signaling planes. The apparatus further comprises a signal blind/buried via coupling a signal pathway of a first one of the at least two signaling planes with a signal pathway of a second one of the at least two signaling planes. The blind/buried via runs through the at least one internal reference plane. The apparatus also comprises at least one first conductive feature in the first one of the at least two signaling planes. The at least one first conductive feature is in close proximity to the signal blind/buried via and increases the capacitive coupling of currents in the reference planes of the apparatus.

24 Claims, 4 Drawing Sheets

U.S. PATENT DOCUMENTS

2009/0031270 A1* 1/2009 Douriet et al. .................. 716/10
2009/0080172 A1* 3/2009 Arslan et al. .................. 361/816

OTHER PUBLICATIONS

Chen, Qinglun et al., "Via and Return Path Discontinuity Impact on High Speed Digital Signal Quality", IEEE, 2000, 4 pages.

Kim, Jingook et al., "Effects on Signal Integrity and Radiated Emission by Split Reference Plane on High-Speed Multilayer Printed Circuit Boards", IEEE Transactions on Advanced Packaging, vol. 28, No. 4, Nov. 2005, pp. 724-735.

* cited by examiner

STRUCTURE FOR ENHANCING REFERENCE RETURN CURRENT CONDUCTION

BACKGROUND

The present application relates generally to an improved structure for enhancing reference return current conduction. More specifically, the present invention is directed to such a structure employed in printed wiring cards employing blind/buried vias.

High signaling rates and large numbers of wide busses are required in today's computing devices, e.g., server computing devices. Such is required in order to transfer data and commands between different subsystems and take full advantage of the processing capabilities of the computing device. In order to accommodate the number of signals and the large collection of interconnections, printed wiring boards have become more complex.

A printed wiring board (PWB), also known as a printed circuit board (PCB) or etched wiring board, is a board that is used to mechanically support and electrically connect electronic components using conductive pathways, tracks, or traces etched from sheets of conductive material laminated onto a non-conductive substrate. A PWB or PCB populated with electronic components is a printed circuit assembly (PCA) or printed circuit board assembly (PCBA). PCBs are inexpensive and generally highly reliable.

Complex technologies have been introduced and utilized in PWBs or PCBs in order to accommodate the signaling and interconnection requirements of modern computing devices. Typically, vias are used in such structures to provide interconnection between layers of the PWBs or PCBs. Vias are pads with plated holes that provide electrical connections between conductive pathways, tracks, or traces on different layers of the PWB or PCB. The holes are made conductive by electroplating, or are filled with annular rings or small rivets. High density multi-layer PWBs or PCBs may have micro-vias.

There are three basic types of vias or micro-vias used for these purposes. A first type of via is the through via which is drilled through the finished laminated card structure. A second type of via is a blind via which has one end of the via exposed to the surface of the card and the other side terminated within the card stack-up of layers. A third type of via is the buried via which has both ends of the via being not exposed to the surface of the card.

One class of complex technology that has been introduced is the use of blind/buried (BB) vias. In one implementation, the blind/buried vias are formed by laminating sub-composites together, each sub-composite employing small quantities of layers and using through hole via technologies, either laser or mechanically drilled, for the sub-composites. That is, a blind via is formed in a sub-composite of the laminated card structure and then is subsequently overlaid with another sub-composite causing the blind via to become buried within the laminated card structure. The resulting vias turn out to be blind/buried (BB) when the complete card is laminated together with the sub-composites stacking up on top of each other. These BB vias and the interconnects they form do not interfere with routing on other sub-composites. As a result, denser wiring is accommodated as compared to a traditional printed circuit process utilizing only plated through holes (PTHs).

SUMMARY

In one illustrative embodiment, an apparatus is provided that comprises a plurality of signaling planes providing signal pathways and at least one internal reference plane providing either a voltage or a ground connection. The at least one internal reference plane are provided between at least two of the signaling planes. The apparatus further comprises a signal blind/buried via coupling a signal pathway of a first one of the at least two signaling planes with a signal pathway of a second one of the at least two signaling planes. The blind/buried via runs through the at least one internal reference plane. The apparatus also comprises at least one first conductive feature in the first one of the at least two signaling planes. The at least one first conductive feature is in close proximity to the signal blind/buried via. The at least one first conductive feature is provided such that a dielectric distance between an outer reference plane and the at least one internal reference plane is reduced.

In another illustrative embodiment, a method is provided that may be used to design and/or fabricate the apparatus described above. Moreover, in still another illustrative embodiment, a computer program product is provided that may be used to implement the method for designing and fabricating the apparatus. The method and computer program product may be implemented in or executed by a system/apparatus that comprises one or more processors and a memory coupled to the one or more processors. The memory may comprise instructions which, when executed by the one or more processors, cause the one or more processors to perform various ones, and combinations of, the operations of the method for designing and/or fabricating the apparatus.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for enhancing the reference return current conduction in printed wiring boards (PWBs) or printed circuit boards (PCBs) that employ blind/buried vias. The enhancement is achieved by providing conductive features in signaling planes or layers between reference planes or layers. These conductive features provide a capacitive coupling of current in the reference planes without using an ohmic connection between the reference planes.

Figure 1:
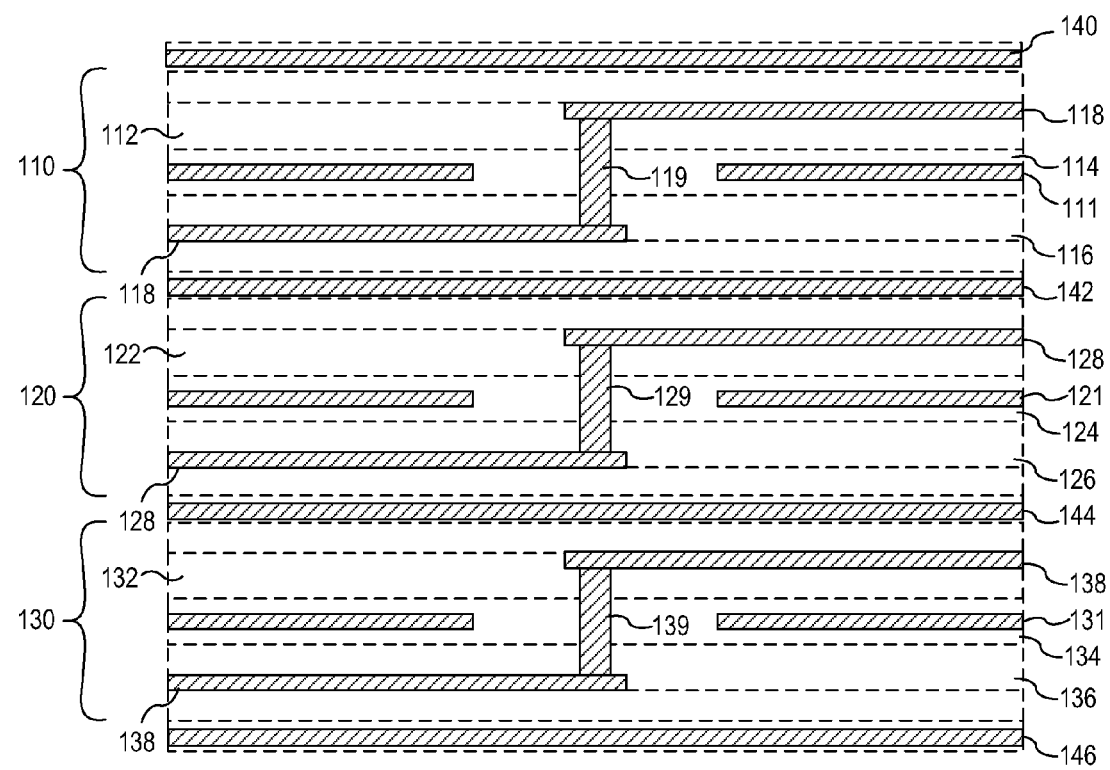
FIG. 1 is an example of a sub-composite stacked up with blind/buried (BB) vias being formed in internal layers of the sub-composite.

As mentioned previously, one way in which blind/buried vias are created is to laminate sub-composites together, each sub-composite employing small quantities of layers and using blind/buried vias. FIG. 1 is an example of a sub-composite stack-up with blind/buried (BB) vias being formed in internal layers of the sub-composite. As shown in FIG. 1, the printed wiring board (PWB) 100 includes a plurality of sub-composites 110, 120, and 130. The sub-composites 110, 120, and 130 each comprise a small number of layers 112-116, 122-126, and 132-136 which may be used for providing signaling wires 118, 128, and 138, referred to as signal layers, and/or reference voltages 111, 121, and 131, referred to as reference layers. One or more of these sub-composites 110, 120, and 130 may comprise BB vias 119, 129, and 139 for connecting two or more of the signal layers of the particular sub-composite 110, 120, and 130.

One drawback to forming sub-composites 110, 120, and 130 in this manner is the inability to provide connections between sets of sub-composites 110, 120, and 130. As shown in FIG. 1, there are no via connections between the sub-composites 110, 120, and 130. For example as shown in FIG. 1, the BB vias 119, 129, and 139 interconnect signals on either side of a reference plane 114, 124, and 134 in each sub-composite 110, 120, and 130, but cannot connect or penetrate through the reference planes 140-146, which may be ground reference planes for example, that are on either side of the signal planes 112, 116, 122, 126, 132, and 136. This results in a reference current discontinuity at the BB via 119, 129, and 139 position on the reference planes 140-146 not penetrated by the BB via 119, 129, and 139.

Figure 2:
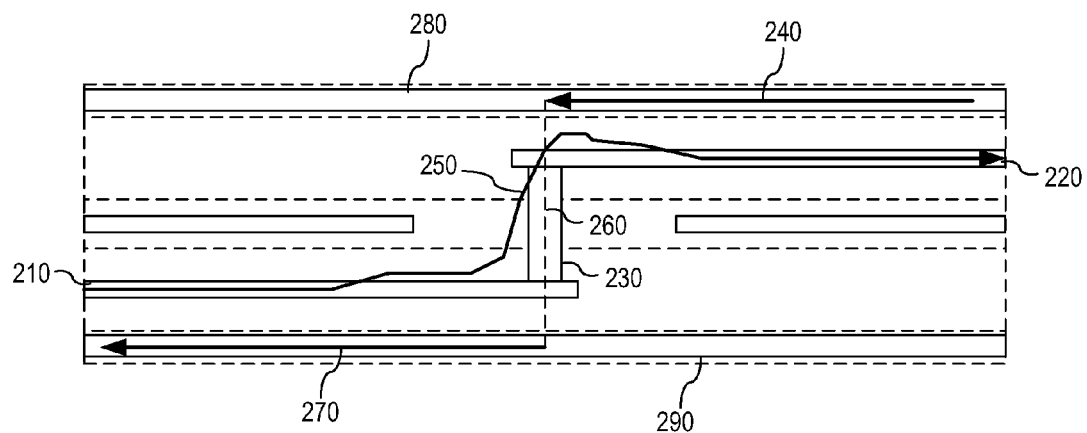
FIG. 2 illustrates the signal current and signal return currents for a single sub-composite, such as may be used in the PWB or PCB or FIG. 1.

FIG. 2 illustrates the signal current and signal return currents for a single sub-composite, such as may be used in the PWB or PCB or FIG. 1. As shown in FIG. 2, the signal current 250 going from left to right runs along the signal wiring of the signal layer 210 and transitions to the signal layer 220 through the BB via 230. The signal return current 240 flows in the opposite direction of the signal current 250 from right to left. The dotted line 260 illustrates the lack of a conductive path for the ground signal return current 270 to transition from the upper reference plane 280 to the lower reference plane 290.

One solution to this issue is to place plated through hole (PTH) vias electrically close to where these BB vias 119, 129, and 139 transitions occur. On a 5 mm grid, these BB vias 119, 129, and 139 would be about half a signal transition time away for some of the modern high speed signals. Unfortunately, such a grid of PTH vias would require resources in every sub-composite and consume routing channels throughout the card stack, even if only addressing reference current discontinuities.

The illustrative embodiments provide a mechanism for coupling current in one reference plane to another without an ohmic connection, such as a via. Such a current conduction path can be formed by capacitance. In fact, in the case described above, the physics of the discontinuity is that, as the signal wavefront progresses (not necessarily in the same direction as the current flow, but for purposes of the description of the illustrative embodiments, it is assumed that the signal wavefront travels from left to right as shown in FIG. 2), the wavefront associated with the return current will be coincident with that of the signal wavefront, but with the induced current on the reference planes flowing in a direction opposite to the signal current.

When the wavefront encounters the discontinuity (illustrated in FIG. 2 by the dotted line 260), the return current will dump charge at the point of discontinuity causing the reference plane voltage signal to increase at that location (or the return current may be sucked out of the point of discontinuity causing the reference plane voltage signal to decrease at that location). This voltage change induces a current in the adjacent planes so that current is transferred to those adjacent planes. Those adjacent planes may be further perturbed by the capacitively conducted current, and further couple into the ground plane on the other side of the BB via. Of course, any other features, including victim signals, may be perturbed by this interaction of the signal return current on the reference plane with the discontinuity.

The illustrative embodiments enhance this capacitive coupling between the planes involved in the discontinuity. One way of enhancing the capacitive coupling is to introduce a conductive feature, e.g., copper feature, on each signal plane in areas near the BB via, but not associated with the signal pathways, tracks, or traces on those planes. A BB via may be used to connect such a conductive feature to an internal reference plane, i.e. a reference plane between signal planes or layers, of a sub-composite. This coupling of the conductive feature to an internal reference plane results in a doubling of the capacitance in the local area of the BB via by halving the dielectric thickness between the internal reference plane and the outer reference planes, i.e. the reference planes at or closest to the top and bottom of the sub-composite, associated with the discontinuous signal reference return path.

Figure 3:
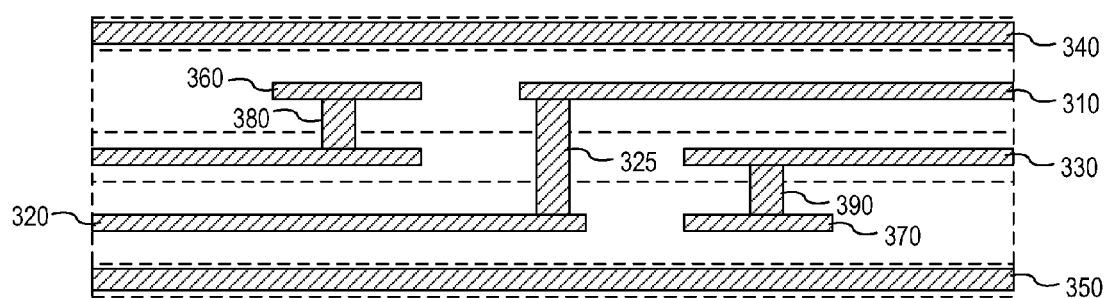
FIG. 3 is an example diagram illustrating a cut-away side view of a sub-composite of a printed wiring board or printed circuit board in accordance with one illustrative embodiment.

FIG. 3 is an example diagram illustrating a cut-away side view of a sub-composite of a printed wiring board or printed circuit board in accordance with one illustrative embodiment. As shown in FIG. 3, the sub-composite 300 is comprised of one or more signal planes or layers 310 and 320, one or more internal reference planes or layers 330, and two or more outer reference planes or layers 340 and 350. The one or more internal reference planes or layers 330 may provide a voltage source while the one or more outer reference planes or layers 340 and 350 may provide a ground connection. The signaling planes or layers 310 and 320 provide signal conduction pathways, tracks, or traces for the sub-composite 300.

In accordance with the illustrative embodiments, conductive features 360 and 370 may be introduced into the signal planes or layers 310 and 320 in close proximity or adjacent to the BB via 325 connecting the signal conduction pathways, tracks, or traces of the signal planes or layers 310 and 320. The conductive features 360 and 370 are coupled to the internal reference plane or layer 330 by BB vias 380 and 390, referred to as conductor BB vias 380 and 390 while the BB via 325 is referred to as the signal BB via 325.

In general, the term "close" in the context of the present description refers to a distance that would keep the characteristic impedance in the via structure substantially the same as that of the signal routes in the signal planes referenced to the power planes, i.e. within an acceptable tolerance of the impedance of the signal routes in the signal planes, the acceptable tolerance being dependent upon the particular implementation. In one implementation, the conductive features 360 and 370 are introduced into the signal planes or layers 310 and 320 based on a distance criteria beyond which the effectiveness of these conductive features 360 is significantly diminished, e.g., a distance determined based on a quarter of a wavelength of the highest frequency in the signal spectrum.

The conductive features 360 and 370 essentially halve the dielectric thickness between conductive elements of the internal reference plane or layer 330 and the outer reference planes or layers 340 and 350, the dielectric material being illustrated in FIG. 3 as the area between the conductive elements of the structure. This couples the current in one reference plane or layer 330 with other reference planes or layers 340 and 350 without an ohmic connection, such as a via, connecting the two reference planes, e.g., 330 with 340 or 330 with 350. By way of the conductive features 360 and 370 and the conductor BB vias 380 and 390, the capacitive coupling between reference planes is increased and, as a result, the return current pathway is improved.

The depiction in FIG. 3 is a simplified depiction of a sub-composite of a printed wiring board or printed circuit board and is not intended to state or imply any limitation with regard to the types or configurations of PWBs or PCBs with which the mechanisms of the illustrative embodiments may be utilized. For example, while FIG. 3 shows only one BB via 325 connecting the signal conduction pathways, in actuality there will typically be many of these BB vias 325 provided. In such an actual implementation, the mechanisms of the illustrative embodiments may be utilized with each of these BB vias 325 throughout the PWB or PCB. Moreover, such conductive features may be utilized in a plurality of sub-composites that make up the PWB or PCB.

It should be appreciated that, in some applications, simply introducing a conductive feature near the BB via may be prohibited. For example, in some structures, if in providing the central reference plane and signal layer conductive features of the illustrative embodiments, there is only a single ply of material between these conductive features and the ground plane above or below it, defects could result in safety hazards. Void defects possible in single ply dielectric materials could develop conductive paths through dendritic growth where conductive features according to the illustrative embodiment might be used. This may cause a fire hazard if the BB via associated with the conductive feature bridges two low impedance, high current planes. However, removing the BB vias that connect the conductive features that increase the plane-to-plane capacitance will significantly reduce the effectiveness of those conductive features to the point that the electronic packaging might have nearly the same performance with or without the presence of these conductive features.

Thus, in another illustrative embodiment, in order to address these issues in some structures, an electrically floating structure is utilized such that a conductive point of failure through any single dielectric will not cause a safety issue, e.g., a fire hazard. This electrically floating structure comprises the conductive features being generated in the signal layers of the sub-composite of the printed wiring board (PWB) or printed circuit board (PCB), but instead of coupling these conductive features to the an internal reference plane of the sub-composite, they are instead coupled to each other by a BB via that is in close proximity to the BB via connecting the signal pathways, tracks, or traces of the signal layers or planes. The BB via connecting the conductive features also penetrates the internal reference plane or layer. The conductive features and the BB via connecting them, as with the previous embodiment, are not ohmically connected to the signal and internal reference planes or layers. The resulting structure is floating electrically so that a conductive point of failure through any single dielectric will not cause a safety problem. However, the conductive features still provide as much capacitive coupling between the reference planes associated with the discontinuous return path as the previously described illustrative embodiment.

Figure 4:
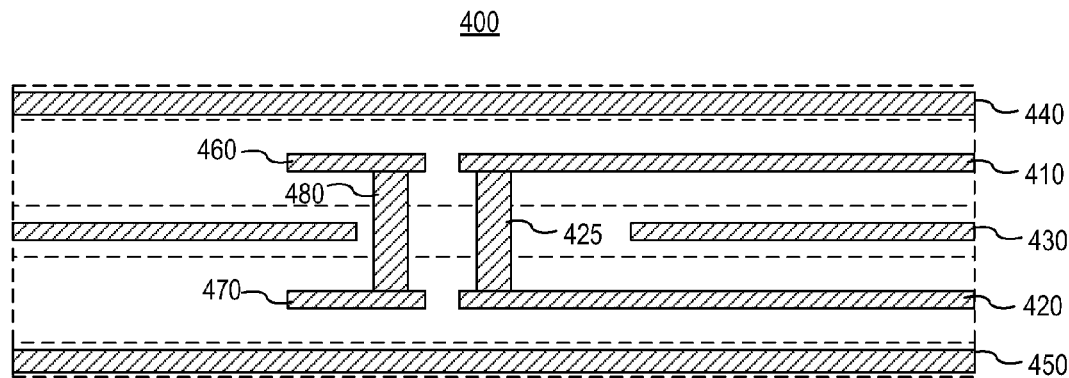
FIG. 4 is an example diagram illustrating a cut-away side view of a sub-composite of a printed wiring board or printed circuit board in accordance with another illustrative embodiment.

FIG. 4 is an example diagram illustrating a cut-away side view of a sub-composite of a printed wiring board or printed circuit board in accordance with another illustrative embodiment. As shown in FIG. 4, as in the embodiment shown in FIG. 3, the sub-composite 400 is comprised of one or more signal planes or layers 410 and 420, one or more internal reference planes or layers 430, and two or more outer reference planes or layers 440 and 450. The one or more internal or outer reference planes or layers 430, 440, and 450 may provide any combination of ground or voltage sources. The signaling planes or layers 410 and 420 provide signal conduction pathways, tracks, or traces for the sub-composite 400.

In accordance with the illustrative embodiments, conductive features 460 and 470 may be introduced into the signal planes or layers 410 and 420 in close proximity or adjacent to the signal BB via 425 connecting the signal conduction pathways, tracks, or traces of the signal planes or layers 410 and 420. Contrary to the previous illustrative embodiment shown in FIG. 3, the conductive features 460 and 470 are coupled to each other, rather than to the internal reference plane or layer 430 by conductor BB via 480. This generates an electrically floating construction. In this way, the problems associated with connecting conductive features with the internal reference plane or layer are avoided while still continuing to provide the same amount of capacitive coupling.

As with the depiction in FIG. 3, the diagram in FIG. 4 is a simplified depiction of a sub-composite of a printed wiring board or printed circuit board and is not intended to state or imply any limitation with regard to the types or configurations of PWBs or PCBs with which the mechanisms of the illustrative embodiments may be utilized. For example, while FIG. 4 shows only one BB via 425 connecting the signal conduction pathways, in actuality there will typically be many of these BB vias 425 provided. In such an actual implementation, the mechanisms of the illustrative embodiments may be utilized with each of these BB vias 425 throughout the PWB or PCB. Moreover, such conductive features may be utilized in a plurality of sub-composites that make up the PWB or PCB.

Figure 5:
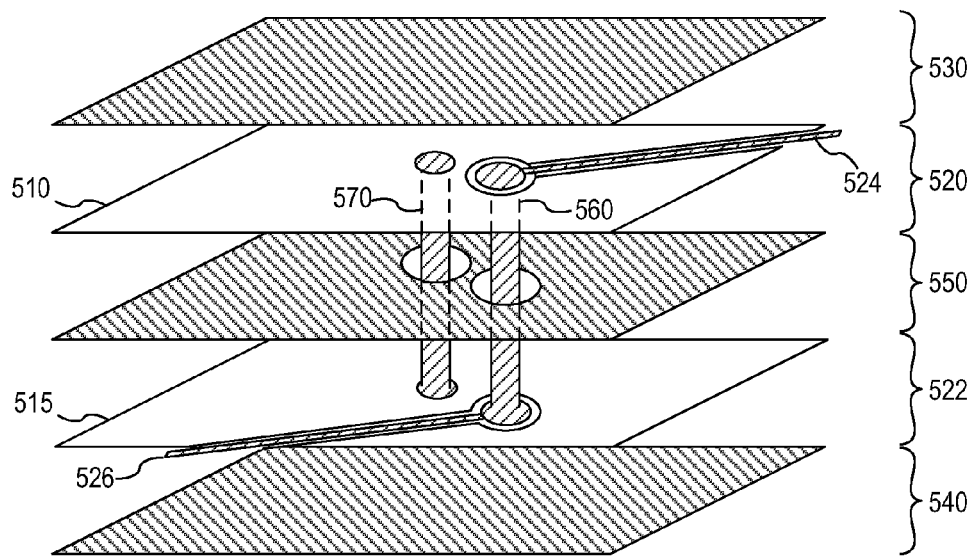
FIG. 5 is an example isometric view of a sub-composite in accordance with one illustrative embodiment.

FIG. 5 is an example isometric view of a sub-composite in accordance with one illustrative embodiment. The example shown in FIG. 5 is of an embodiment similar to that shown in FIG. 4. FIG. 5 is provided to illustrate an example configuration of the conductive features. In this particular case, the conductive feature is configured as plane fills 510 and 515. Other configurations, such as meshes, shapes, or the like, may be used without departing from the spirit and scope of the illustrative embodiments. It should be appreciated, that such conductive feature configurations can also be used with other embodiments of the present invention, such as the embodiment shown in FIG. 3, for example.

As shown in FIG. 5, the conductive features 510 and 515 are provided in signal planes 520 and 522 between the outer reference planes 530, 540 and the inner reference plane 550. Signal lines, pathways, traces, tracks, etc., 524 and 526 run along the signal planes 520 and 522 and are connected to each other via the signal BB via 560. It should be noted that the signal BB via 560 and signal lines 524, 526 are not coupled to the plane fill conductive features 510 and 515 or the inner reference plane 550. That is, there is a gap between the signal BB via 560 and signal lines 524, 526, and the conductive features 510 and 515 and the inner reference plane 550.

A conductor BB via 570 couples the plane fill conductor features 510 and 515. It should be noted that the conductor BB via 570 is in close proximity or is adjacent the signal BB via 560. However, the conductor BB via 570 does not connect to the inner reference plane 550. The conductor BB via 570 connects the plane fill conductor features 510 and 515 to aid capacitive return current coupling between the outer reference planes 530 and 540.

It should be noted that the nature of the conductive features in the above illustrative embodiments is that they are made of a conductive material, such as copper or the like, and formed as line segments, meshes, shapes, or the like. The number and location of the BB vias interconnecting these conductive features, i.e. conductor BB vias, is flexible. Thus, it is not necessary for these conductive features to be adjacent or in close proximity to the BB vias connecting signal pathways, tracks, or traces, i.e. signal BB vias. However, in preferred embodiments, it is desirable to have the conductor BB vias connecting conductive features to each other or to reference planes be adjacent or in close proximity to the signal BB vias so as to enhance their effectiveness in transferring the return currents between planes or layers of the sub-composite.

Furthermore, while the size of these conductive features may be as extreme as a flood fill with the conductor BB vias connecting together fills on the various signal planes or layers in close proximity or adjacent the signal BB vias, the effectiveness of these conductive features is diminished for dimensions over a quarter of a wavelength of any frequency at which the signal is content. For example, if the bit rate is 3 Gbps, then the size of the conductive features may be best kept to less than approximately 44 ps electrically (the $5^{th}$ harmonic), or approximately 6 mm on a side.

It should also be noted that in preferred embodiments, the conductive features should be placed near and/or around the signal BB via with a portion of the shape being vertically adjacent the signal BB via to make the BB via connection between the conductive feature and either another conductive feature or an internal reference plane. There is no requirement that the conductive features all utilize the same configuration, i.e. the same shape, mesh, or the like. Moreover, the connection between conductive features may be performed through a jog connection with one or more internal reference planes or layers. That is, one conductive feature may connect to an internal reference plane via a first conductor BB via and a second conductive feature, in a different signal layer or plane, may connect to the same internal reference plane via a second conductor BB via such that the internal reference plane acts as a jog connection that connects the two conductive features.

Other modifications to the configurations and arrangements of elements described above in the illustrative embodiments may be made without departing from the spirit and scope of the illustrative embodiments.

The sub-composites and printed wiring board (PWB) or printed circuit board (PCB) utilizing the mechanisms of the illustrative embodiments may be created using a fabrication method generally known in the art. The method may comprise laying out the design of the various layers of the sub-composites and the PWB or PCB as a whole. The design may comprise the conductive features, BB vias, and other constructions previously discussed. The design may then be fabricated using known PWB or PCB fabrication mechanisms. Thus, the illustrative embodiments may further comprise a method for providing such sub-composites and PWBs or PCBs by providing the various planes or layers of the sub-composites and combining more than one sub-composite into a PWB or PCB. In providing the various planes or layers of the sub-composites, the conductive features, BB vias, and the like, as described previously, may be provided in appropriate ones of these planes or layers.

Moreover, the illustrative embodiments may implement the design of these sub-composites, PWBs, PCBs, and the like, using a computer program product implemented in hardware, software, or any combination of hardware and software. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 6:
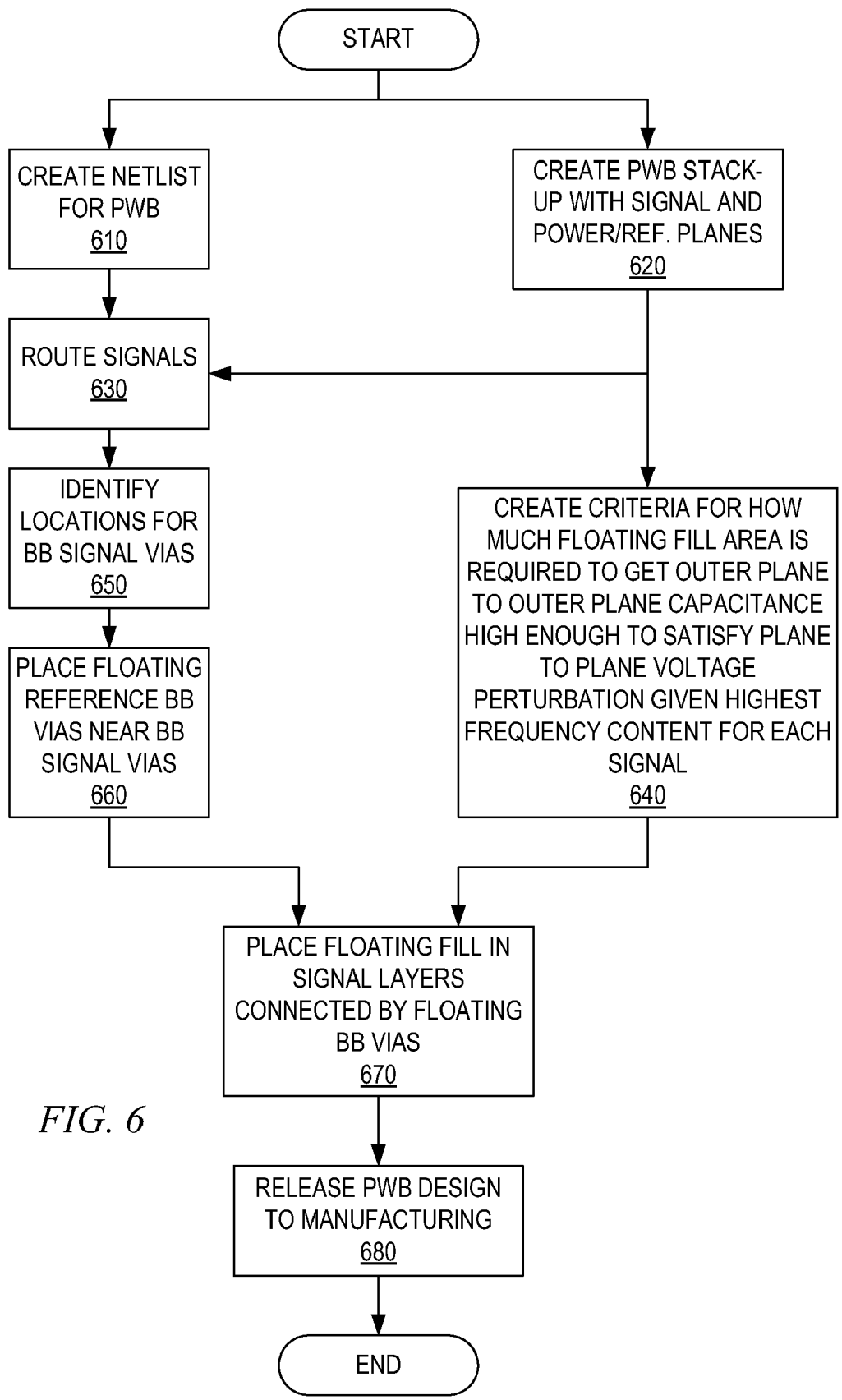
FIG. 6 is a flowchart outlining an example operation for designing and fabricating a PWB or PCB utilizing the structures of the illustrative embodiments described above.

FIG. 6 is a flowchart outlining an example operation for designing and fabricating a PWB or PCB utilizing the structures of the illustrative embodiments described above. As mentioned above, the design of the PWB or PCB may be performed in one or more data processing devices or systems using design software that is generally known in the art. The design itself, however, and the process by which the software mechanisms are utilized, however, is unique to this invention. The various ones of the steps in FIG. 6 may be performed manually or automatically, depending upon the particular implementation selected.

As shown in FIG. 6, the operation starts with two branches that may be performed substantially in parallel. In a first branch, a netlist for the printed wiring board (PWB) is created (step 610) and in the second branch a PWB stack-up design is created that includes the signal and power/reference planes (step 620). Thereafter, the second branch may provide the PWB stack-up to the first branch at step 630 where signals are routed based on the PWB netlist and the PWB stack-up (step 630). In the second branch, criteria are created for how much floating fill area is required to get outer plane to outer plane capacitance high enough to satisfy plane to plane voltage perturbation given a highest frequency content for each signal (step 640). As can be appreciated from the above description, such criteria may be calculated based on predetermined formulaic relationship between a desired outer plane to outer plane capacitance and the expected highest frequency content for each signal.

Returning to the first branch, locations for the BB signal vias are identified (step 650) and floating reference BB vias are placed near the BB signal vias (step 660). Thereafter, based on the criteria created in step 640 and the placement of the floating reference BB vias in step 660, placement of the floating fill is performed in signal layers connected by the floating BB vias (step 670). The PWB design is then released to manufacturing (step 680) where the PWB is then manufactured based on the design.

The computer program product implementing the operation shown in FIG. 6 may be executed or may operate within a data processing system. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, comprising:
a plurality of signaling planes having signal pathways therein;
an internal reference plane having either a voltage or a ground connection, the internal reference plane being positioned between at least two of the signaling planes;
a signal blind/buried via coupling a signal pathway of a first signaling plane, of the at least two signaling planes, with a signal pathway of a second signaling plane, of the at least two signaling planes, the signal blind/buried via running through the internal reference plane;
an outer reference plane positioned on an opposite side of a signal plane from a side of the signal plane adjacent the internal reference plane; and
a conductive feature in the first signaling plane, the conductive feature being in close proximity to the signal blind/buried via, wherein the conductive feature is positioned such that a dielectric distance between the outer reference plane and the internal reference plane is reduced, wherein the conductive feature increases a capacitive coupling of a current in the internal reference plane with a current in the outer reference plane, without an ohmic connection between the internal reference plane and the outer reference plane, and wherein the conductive feature is not ohmically coupled to the signal pathways of the at least two signaling planes.

2. The apparatus of claim 1, further comprising:
a second conductive feature in the second signaling plane, the second conductive feature being in close proximity to the signal blind/buried via.

3. The apparatus of claim 2, wherein the second conductive feature is not ohmically coupled to the signal pathways of the at least two signaling planes.

4. The apparatus of claim 1, wherein the plurality of signaling planes, internal reference plane, signal blind/buried via, and conductive feature are part of a sub-composite of a printed wiring board.

5. The apparatus of claim 4, wherein the apparatus is a printed wiring board comprising a plurality of sub-composites.

6. The apparatus of claim 2, wherein the first conductive feature and the second conductive feature are positioned at a distance from the signal blind/buried via that causes a characteristic impedance in the signal blind/buried via to be substantially the same as signal pathways in the signaling planes.

7. The apparatus of claim 2, wherein the first conductive feature and the second conductive feature are positioned at a distance from the signal blind/buried via that is determined based on a quarter of a wavelength of a highest frequency in a signal spectrum of signals being transmitted along the signal pathways of the signaling layers.

8. A method, in a data processing system, for designing a printed wiring board (PWB), comprising:
generating, in the data processing system, within the design of the PWB, a plurality of signaling planes having signal pathways therein;
generating, in the data processing system, within the design of the PWB, an internal reference plane having either a voltage or a ground connection, the internal reference plane being positioned between at least two of the signaling planes;
generating, in the data processing system, within the design of the PWB, a signal blind/buried via coupling a signal pathway of a first signaling plane, of the at least two signaling planes, with a signal pathway of a second signaling plane, of the at least two signaling planes, the blind/buried via running through the internal reference plane;
generating, in the data processing system, within the design of the PWB, an outer reference plane positioned on an opposite side of a signal plane from a side of the signal plane adjacent the internal reference plane;
generating, in the data processing system, within the design of the PWB, a conductive feature in the first signaling plane, the conductive feature being in close proximity to the signal blind/buried via, wherein the conductive feature is positioned such that a dielectric distance between the outer reference plane and the internal reference plane is reduced; and
outputting the design of the PWB for fabrication of the PWB, wherein the conductive feature increases a capacitive coupling of a current in the internal reference plane with a current in the outer reference plane, without an ohmic connection between the internal reference plane and the outer reference plane, and wherein the conductive feature is not ohmically coupled to the signal pathways of the at least two signaling planes.

9. The method of claim 8, further comprising:
generating, in the data processing system, within the design of the PWB, a second conductive feature in the second signaling plane, the second conductive feature being in close proximity to the signal blind/buried via.

10. The method of claim 9, wherein the second conductive feature is not ohmically coupled to the signal pathways of the at least two signaling planes.

11. The method of claim 8, wherein the plurality of signaling planes, internal reference plane, signal blind/buried via, and first conductive feature are part of a sub-composite of the design of the PWB.

12. The method of claim 11, wherein the design of the PWB comprises a plurality of sub-composites.

13. The method of claim 9, wherein the first conductive feature and the second conductive feature are positioned at a distance from the signal blind/buried via that causes a characteristic impedance in the signal blind/buried via to be substantially the same as signal pathways in the signaling planes.

14. The method of claim 9, wherein the first conductive feature and the second conductive feature are positioned at a distance from the signal blind/buried via that is determined based on a quarter of a wavelength of a highest frequency in a signal spectrum of signals being transmitted along the signal pathways of the signaling layers.

15. A computer program product comprising a computer readable storage medium having a computer readable program stored therein, wherein the computer readable program, when executed on a computing device, causes the computing device to:
generate, within a design of a printed wiring board (PWB) a plurality of signaling planes having signal pathways;
generate, within the design of the PWB, an internal reference plane having either a voltage or a ground connection, the internal reference plane being positioned between at least two of the signaling planes;
generate, within the design of the PWB, a signal blind/buried via coupling a signal pathway of a first signaling plane, of the at least two signaling planes, with a signal pathway of a second signaling plane, of the at least two signaling planes, the blind/buried via running through the internal reference plane;
generate, within the design of the PWB, an outer reference plane positioned on an opposite side of a signal plane from a side of the signal plane adjacent the internal reference plane;
generate, within the design of the PWB, a conductive feature in the first signaling plane, the conductive feature being in close proximity to the signal blind/buried via, wherein the conductive feature is positioned such that a dielectric distance between the outer reference plane and the internal reference plane is reduced; and
output the design of the PWB for fabrication of the PWB, wherein the conductive feature increases a capacitive coupling of a current in the internal reference plane with a current in the outer reference plane, without an ohmic connection between the at least one internal reference plane and the outer reference plane, and wherein the conductive feature is not ohmically coupled to the signal pathways of the at least two signaling planes.

16. The computer program product of claim 15, further comprising:
generating, within the design of the PWB, a second conductive feature in the second signaling plane, the second conductive feature being in close proximity to the signal blind/buried via.

17. The computer program product of claim 16, wherein the second conductive feature is not ohmically coupled to the signal pathways of the at least two signaling planes.

18. The computer program product of claim 15, wherein the plurality of signaling planes, internal reference plane, signal blind/buried via, and conductive feature are part of a sub-composite of the design of the PWB.

19. The computer program product of claim 15, wherein the design of the PWB comprises a plurality of sub-composites.

20. The computer program product of claim 16, wherein the first conductive feature and the second conductive feature are positioned at a distance from the signal blind/buried via that causes a characteristic impedance in the signal blind/buried via to be substantially the same as signal pathways in the signaling planes.

21. The computer program product of claim 16, wherein the first conductive feature and the second conductive feature are positioned at a distance from the signal blind/buried via that is determined based on a quarter of a wavelength of a highest frequency in a signal spectrum of signals being transmitted along the signal pathways of the signaling layers.

22. The apparatus of claim 1, wherein the first conductive feature and the second conductive feature are coupled to each other by way of a blind buried via, and wherein the first conductive feature, second conductive feature, and blind buried via together constitute a floating structure in the apparatus.

23. The method of claim 8, wherein the first conductive feature and the second conductive feature are coupled to each other by way of a blind buried via, and wherein the first conductive feature, second conductive feature, and blind buried via together constitute a floating structure in the design of the MB.

24. The computer program product of claim 15, wherein the first conductive feature and the second conductive feature are coupled to each other by way of a blind buried via, and wherein the first conductive feature, second conductive feature, and blind buried via together constitute a floating structure in the design of the PWB.

* * * * *